(12) United States Patent
Mendel

(10) Patent No.: US 6,246,260 B1
(45) Date of Patent: *Jun. 12, 2001

(54) PROGRAMMABLE LOGIC INTEGRATED CIRCUIT ARCHITECTURE INCORPORATING A GLOBAL SHAREABLE EXPANDER

(75) Inventor: David W. Mendel, Sunnyvale, CA (US)

(73) Assignee: Altera Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/371,440

(22) Filed: Aug. 10, 1999

Related U.S. Application Data

(63) Continuation of application No. 08/835,557, filed on Apr. 8, 1997.
(60) Provisional application No. 60/014,629, filed on Apr. 9, 1996, and provisional application No. 60/011,422, filed on Apr. 9, 1996.

(51) Int. Cl.[7] .............................................. H03K 19/177
(52) U.S. Cl. .............................................. 326/41; 326/39
(58) Field of Search ........................................ 326/37–41

(56) References Cited

U.S. PATENT DOCUMENTS

| | | | |
|---|---|---|---|
| 4,609,986 | 9/1986 | Hartmann et al. | 364/200 |
| 4,617,479 | 10/1986 | Hartmann et al. | 307/465 |
| 4,677,318 | 6/1987 | Veenstra et al. | 307/465 |
| 4,713,792 | 12/1987 | Hartmann et al. | 364/900 |
| 4,789,951 | 12/1988 | Birkner et al. . | |
| 4,871,930 | 10/1989 | Wong et al. | 307/465 |
| 4,899,067 | 2/1990 | So et al. | 307/465 |
| 4,903,223 | 2/1990 | Norman et al. | 364/716 |
| 4,912,342 | 3/1990 | Wong et al. | 307/465 |
| 5,046,035 | 9/1991 | Jigour et al. . | |
| 5,121,006 | 6/1992 | Pedersen et al. | 307/465 |
| 5,231,588 | 7/1993 | Agrawal et al. . | |
| 5,241,224 | 8/1993 | Pedersen et al. | 307/465 |
| 5,247,195 | 9/1993 | Turner et al. . | |
| 5,260,610 | 11/1993 | Pedersen et al. | 307/465 |
| 5,260,611 | 11/1993 | Cliff et al. | 307/465 |
| 5,350,954 | 9/1994 | Patel et al. | 307/465 |
| 5,359,242 | 10/1994 | Veenstra . | |
| 5,371,422 | 12/1994 | Patel et al. | 326/41 |
| 5,384,500 | 1/1995 | Hawes et al. . | |
| 5,399,922 | 3/1995 | Kiani et al. . | |
| 5,504,440 | 4/1996 | Sasaki . | |
| 5,570,040 | 10/1996 | Lytle et al. . | |

FOREIGN PATENT DOCUMENTS 0 227 329  7/1987  (EP) .

OTHER PUBLICATIONS

Altera Corp., *1996 Data Book*, Chapter 5 "Max 7000," pp. 191–219 (Jun. 1996).

(List continued on next page.)

*Primary Examiner*—Michael Tokar
*Assistant Examiner*—Don Phu Le
(74) *Attorney, Agent, or Firm*—Townsend and Townsend and Crew LLP

(57) ABSTRACT

A logic element for a programmable logic device to implement a global shareable expander. The logic element includes logic modules (P0–P4) for implementing combinatorial logic and a register (445). The combinatorial and registered paths of a logic element may be utilized at the same time. The logic modules may be programmably coupled to the register. The output of the register may be programmably coupled through an output buffer (515) to an I/O pad (520) of the integrated circuit. The logic modules may bypass the register and directly programmably couple through the output buffer to the I/O pad. A logic module may be used as a shareable expander by programmably coupling the module through to a global interconnect with other logic modules in LABs coupled to the global interconnect.

31 Claims, 3 Drawing Sheets

OTHER PUBLICATIONS

Xilinx Corp., *The Programmable Logic Data Book*, "XC4000, XC4000A, XC4000H Logic Cell Array Families" pp. 2–7—2–46 (1994).

Xilinx Corp., *The Programmable Logic Data Book*, "XC3000, XC3000A, XC3000L, XC3100, XC3100A Logic Cell Array Families," pp. 2–105—2–152 (1994).

Altera Corp., "FLEX 8000 Programmable Logic Device Family" data sheet, pp. 1–22 (version 4, Aug., 1994).

Xilinx Corp., *The Programmable Logic Data Book*, "XC5200 Logic Cell Array Family," pp. 1–42 (Preliminary (v2.0), May 1995).

Altera Corp., *1993 Data Book*, "MAX 7000 Programmable Logic Device Family" data sheet, Aug. 1993, ver. 1, pp. 69–81.

Altera Corp., "FLEX 10K Embedded Programmable Logic Family" data sheet, Jul. 1995, ver. 1, pp. 1–56.

Altera Corp., *1995 Data Book*, "Max 9000," Mar. 1995, pp. 119–148.

PROGRAMMABLE LOGIC INTEGRATED CIRCUIT ARCHITECTURE INCORPORATING A GLOBAL SHAREABLE EXPANDER

This application is a continuation of U.S. patent application Ser. No. 08/835,557, filed Apr. 8, 1997, which claims the benefit of U.S. provisional application Ser. No. 60/014,629, filed Apr. 9, 1996, and Ser. No. 60/011,422, filed Apr. 9,1996, which are incorporated by reference.

BACKGROUND OF THE INVENTION

The present invention relates to the field of integrated circuits and their operation. More specifically, one embodiment the invention provides an improved logic device, as well as an improved method of operating a logic device.

Logic devices and methods of their operation are well known to those of skill in the art. Programmable logic devices have found particularly wide application as a result of their combined low up-front cost and versatility to the user.

Altera's FLEX® and MAX® lines of programmable logic are among the most advanced and successful programmable logic devices. In the FLEX® 8000 logic devices, for example, a large matrix of logic elements (LEs) is utilized. In one commercial embodiment of such devices, each LE includes a 4-input look-up table for performance of combinational logic (e.g. AND, OR, NOT, XOR, NAND, NOR, and many others) and a register that provides sequential logic features.

The LEs are arranged in groups of, for example, eight to form larger logic array blocks (LABs). The LABs contain, among other things, a common interconnection structure. The various LABs are arranged in a two-dimensional array, with the various LABs connectable to each other and to pins of the device though continuous lines that run the entire length/width of the device. These lines are referred to as row interconnect (GH) and column interconnect (GV) or "global" interconnect lines. In Altera's line of products these may include what are referred to as "Horizontal Fast Tracks™" and "Vertical Fast Tracks™."

The MAX® 7000 logic devices by way of contrast utilize what are commonly referred to as "macrocells" (analagous to LEs) as a basic logic element. The macrocells are arranged in groups of, for example, sixteen to form larger logic array blocks (LABs). A programmable interconnect array (PIA) selectively links together the multiple LABs. The PIA is a global bus that is fed by all dedicated inputs, I/O pins, and the various macrocells. The PIA is analogous to global interconnect, GHs and GVs. For example, the PIA may be fed by signals that will be used as logic inputs, global controls for secondary register functions in the LABs, input paths from I/O pins to registers that are used for setup of the device, etc.

Inputs to the LABs include inputs from pins (via I/O control blocks), the PIA, and various control (e.g. clock) pins. Logic inputs are provided to one or more of five AND devices, the outputs of which are provided to a product term select matrix. The product term select matrix selects which inputs will be provided to an OR or XOR function, or as secondary inputs to registers in the macrocell. Product terms may be shared between macrocells for complex logic functions. Outputs form the LABs are provided to the I/O control block to the PIA and/or various output pins.

The FLEX® and MAX® logic devices have met with substantial success and are considered pioneering in the area of programmable logic. While pioneering in the industry, certain limitations still remain. For example, the present invention recognizes that it would be desirable to further increase the flexibility of such devices to perform logic.

From the above it is seen that an improved programmable logic device and method of operation therefore is desired.

SUMMARY OF THE INVENTION

The present invention is a logic element or macrocell for a programmable logic device which provides a shareable expander feature where logic modules and product terms in a particular LAB nay be combined using a global interconnect with logic modules and product terms in other LABs within the programmable logic device. The logic element may also incorporate a lonely register feature so that combinatorial and registered functions may be implemented more efficiently in a single logic element. These features improve the overall utilization of the resources of the programmable logic device. Consequently, logic may be more densely packed in the PLD, and an individual PLD may be used to implement more complex functions and operations.

In particular, the logic element includes logic modules for implementing combinatorial logic and a register. The combinatorial and registered paths of a logic element may be utilized at the same time. The logic modules may be programmably coupled to the register. The output of the register may be programmably coupled through a programmable interconnect array to an output buffer and an I/O pad of the integrated circuit. The logic modules may bypass the register and directly programmably coupled through the programmable interconnect array. A logic module may programmably couple through the programmable interconnect array to one or more output buffers. Some logic elements may directly couple to an output buffer and I/O pad.

A logic module may also be used as a shareable expander by programmably coupling the module through to a global interconnect and combining it with other logic modules in LABs coupled to the global interconnect. By using a logic module as a shareable expander, the logic module may still be used for other functionality at the same time. In particular, the logic module may have a regular logic module output and a shareable expander output.

In accordance with the teachings of this invention, a logic element for a programmable logic device is disclosed. The logic element includes a first multiplexer which is coupled to the programmable interconnect array of the programmable logic device. A plurality of logic modules or product terms is coupled to the first multiplexer. The logic modules may be programmably configured to implement combinatorial logic functions. A register is coupled to the first multiplexer and the plurality of the logic modules. The register allows the implementation of registered functions. A particular logic module may be programmably coupled to the register while other logic modules are programmably coupled to the first multiplexer, bypassing the register.

Other objects, features, and advantages of the present invention will become apparent upon consideration of the following detailed description and the accompanying drawings, in which like reference designations represent like features throughout the figures.

DETAILED DESCRIPTION

Figure 1:
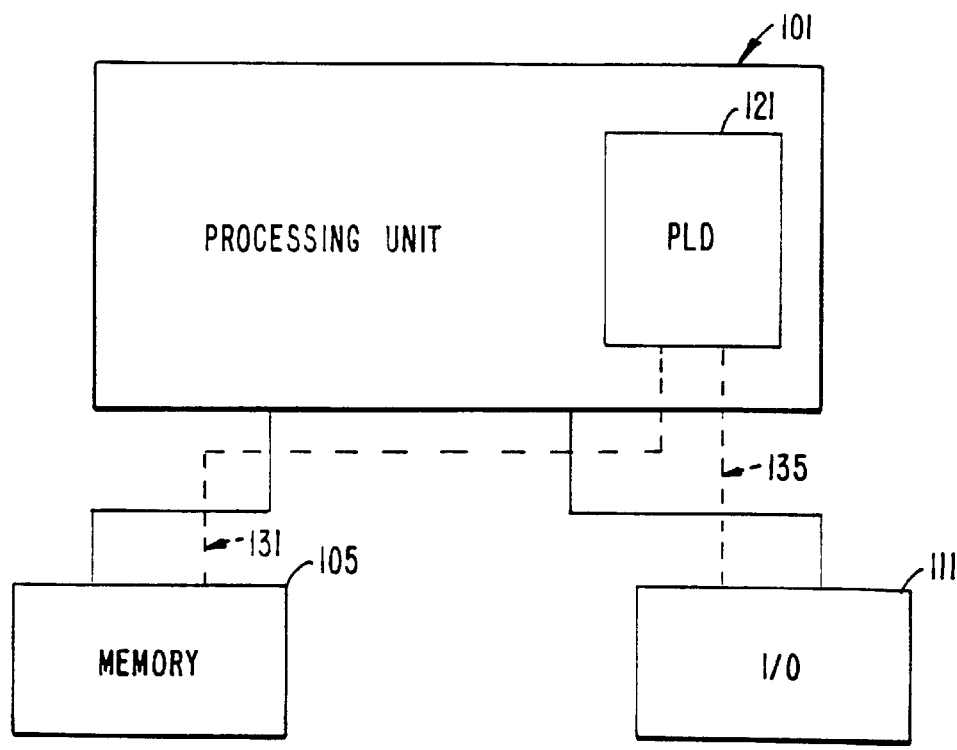
FIG. 1 is a diagram of a system incorporating a programmable logic device.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices (sometimes referred to as a PALs, PLAs, FPLAs, PLDs, EPLDs, CPLDs, EEPLDs, LCAs, or FPGAs), are well know integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs ad FLEX® series of PLDs. The former are described in, for example, U.S. Pat. Nos. 5,241,224 and 4,871,930, and the *Altera Data Book*, June 1996, all incorporated herein by reference. The latter are described in, for example, U.S. Pat. Nos. 5,258, 668, 5,260,610, 5,260,611 and 5,436,575, and the *Altera Data Book*, June 1996, all incorporated herein by reference for all purposes. Logic devices and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moroever, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessr, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
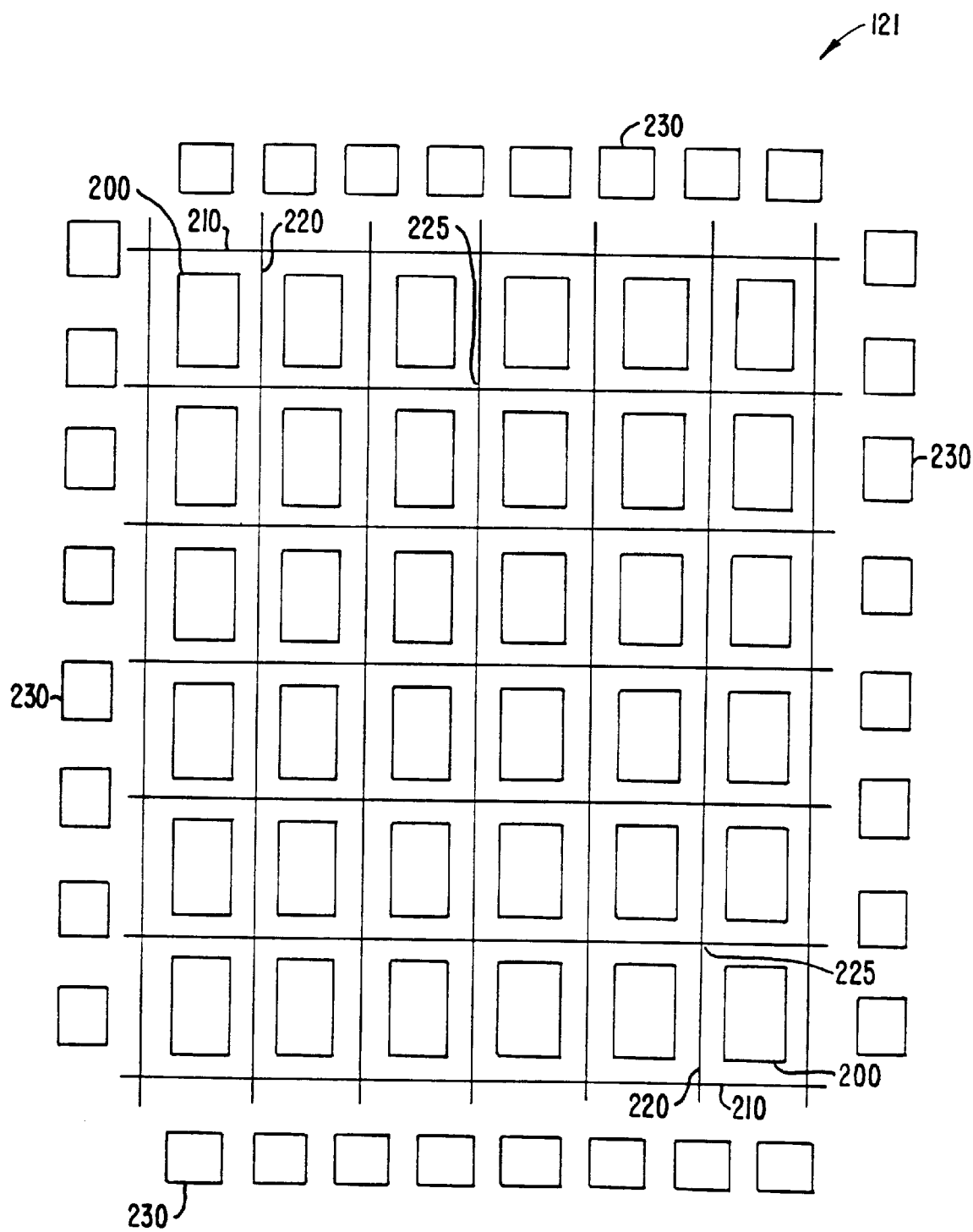
FIG. 2 is a block diagram showing the overall architecture of a programmable logic device incorporating the present invention.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2. Some PLDs may even contain a single LAB. However, generally in the future, as technology advances and improves, programmable logic devices with even greater numbers of logic array blocks will undoubtedly be created.

Furthermore, LABs 200 need not be organized in a square or rectangular matrix. While a rectangular or square array is generally an efficient layout structure, any arrangement of LABs inside the PLD may be conceived. For example, the array may be organized in a five-by-seven or a twenty-by-seventy matrix of LABs. There area also many variations of this architecture. For example, a PLD may have multiple rows of LABs in two columns. There may also be an arrangement of 1-by-N LABs in a PLD, where N is an integer. In a very basic architecture, there may only be GV lines or only GH lines since signals do not need to be interconnected to a third column. Specifically, a PLD may have two columns by any number of rows interconnect. As a further example, a PLD may have one column and any number of rows of interconnect. Furthermore, in some circumstances some number of LABs may be replaced by different types of programmable structures.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200. In some products, the global interconnect may be referred to as a global interconnect array (GIA) or a programmable interconnect array (PIA).

In one embodiment, GH 210 and GV 220 conductors may or may not be programmably connectable at intersections 225 of these conductors. Also, in some embodiments, intersection 225 may have programmable drivers for selecting the signal from a conductor in one direction and buffer the signal and drive it onto one of the alternate conductors in the same or different direction. Moreoever, GH 210 and GV 220 conductors may make multiple connections to other GH 210 and GV 220 conductors. Various GH 210 and GV 220 conductors may be programmably connected together to create a signal path from a LAB 200 at one location on PLD 221 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments or the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both. GH 210 and GV 220 conductors may also pass signals in multiple directions. For example, a global conductor may be used as a bidirectional tristate bus.

In particular embodiments the global interconnect may contain long and segmented conductors. Long conductors run the entire length or width of PLD 121. In particular, long conductors may programmably couple LABs along a length or width of PLD 121. Segmented conductors are for shorter length interconnections. For example, segmented conductors may include double lines for interconnections between two LABs 200. Other segmented conductors include, among other, triple lines, quadruple lines, quintuple lines, sextuple lines, and other similar interconnection resources. Furthermore, at intersections 225, segmented conductors may be programmably coupled (or programmably uncoupled) to other long or segmented conductors, in the same or different direction. Intersection 225 may sometimes be referred to as a "switch box." As an example, a double line may be programmably coupled to other double, long, or segmented lines, in the same or different direction, at intersections 225.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
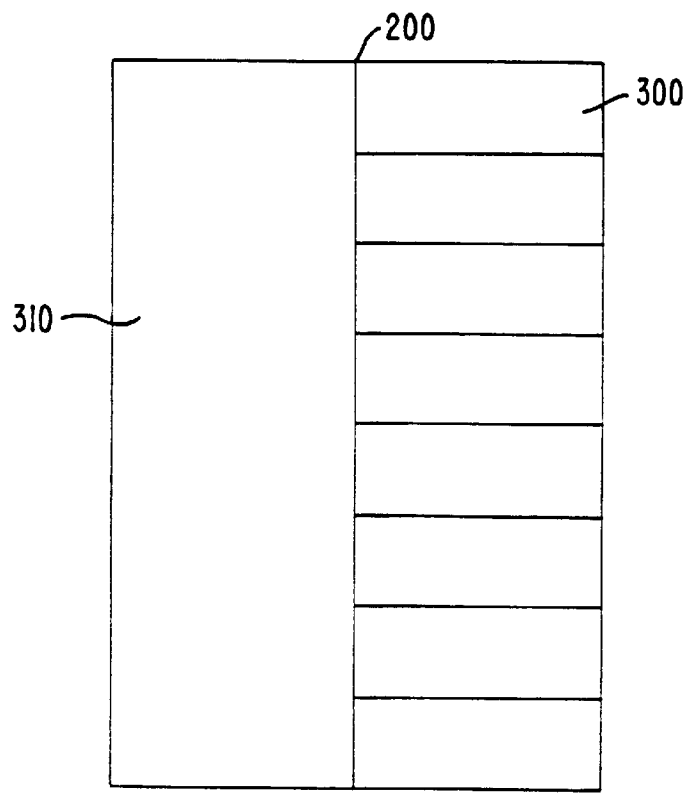
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells" or "macrocells." Some embodiments of LAB 200 may include a local (or internal) interconnect structure 310. The local interconnect is analogous to a local PIA. Some embodiments of LABs 201 do not include a local interconnect structure, but may use GVs, GHs, and PIA, to name just a few. LAB 200 has eight LEs 300, but LAB 200 may have nay number of LEs, more or less than eight. In a further embodiment of the present invention, LAB 200 has two "banks" of eight LEs for a total of sixteen LEs, where each bank has common inputs, but separate outputs and control signals. In some embodiments, LAB 200 includes carry chains or parallel expander chains.

A general overview of LE 300 is presented here, sufficient to provide a basic understanding of LAB 200. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops. The function generator may be implemented using product terms, look-up tables, logic gates, logic modules, and others.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 4:
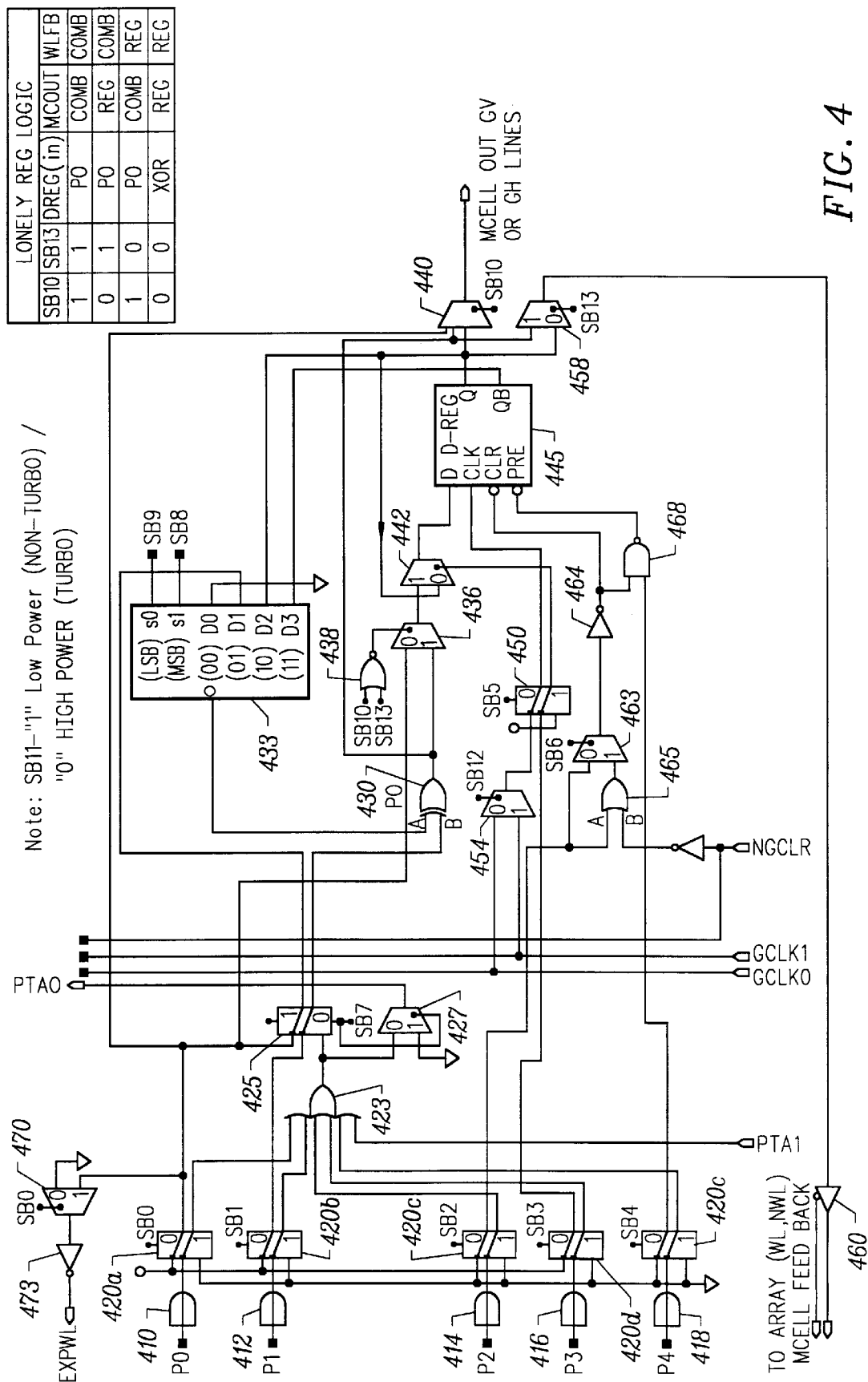
FIG. 4 is a diagram of a logic element of the present invention incorporating a global shareable expander and a lonely register.

FIG. 4 is a diagram of a logic element or macrocell of the present invention. The logic element includes a plurality of AND gates 410, 412, 414, 416, and 418. Each of the plurality of AND gates is associated with a respective plurality of inputs P0, P1, P2, P3, and P4, which may be referred to as product terms. Product terms and AND gates implement a type of logic module for performing logical functions. In this case, product terms P0–P4 provide programmable AND functionality. Depending on what inputs are programmable coupled to the products terms, different logic functions may be implemented. In further embodiments of the present invention, other types of logic modules may be used. These logic modules would provide other functionality including look-up tables, RAMs, FIFOs, registers, logic gates, and many others.

In the present invention, the product terms inputs may be programmably coupled to signals from the local interconnect of the LAB as well as the global interconnect and signals external to the LAB. For example, product term P0 may be coupled to a plurality of signals such as A1, A2, A3, . . . Ai as well as complements of these signals. An output of AND 410 would be an AND function of the inputs programmably coupled to AND gate 410.

In a specific embodiment, product term P0, which is a shareable product term expander, may be coupled to local interconnect 310 and not the global interconnect. Many other interconnect variations are possible.

The outputs of the AND gates are further coupled to a plurality of 3-to-2 multiplexers 420a–e. These multiplexers are used to programmably couple the product terms to other components in the LE. Each multiplexer is programmably controlled by way of a respective programmable bit (i.e., SB0, SB1, SB2, SB3, SB4). These programmable bits may be implemented using cells from RAM, DRAM, SRAM, EEPROM, EPROM, fuse, antifuse, ferro-magnetic, and other technologies. For example, a programmable bit may comprise a plurality of SRAM or EEPROM cells. A first output of each multiplexer is coupled to an OR gate 423. For this first output, each multiplexer selects from one of two inputs, VSS or an output from a respective AND gate product term, to couple to OR gate 423. For example, multiplexer 420c may programmable couple the output from AND gate 414 (product term P2) to an input of OR gate 423. Using multiplexers 420a–e, inputs to OR gate 423 may also be programmably coupled to VSS, which may be used to disable an unused input of OR gate 423. An input PTAI to OR gate 423 is a logical output from a different LE. In a specific embodiment, PTAI is an output from an OR gate in a neighboring LE. This path allows interconnections of the logic elements without using the local or global interconnect.

As those of skill in the art will recognize, by using the programmable AND gates and OR gate of the present invention, many different logic functions may be programmably implemented. In other embodiments of the invention, however, logic function may also be programmably performed using other types of components and logic modules including NAND gates, OR gates, XOR gates, look-up tables, flip-flops, registers, FIFOs, RAMs, and SRAMs, to name a few.

A second output from multiplexer 420a, a second output from multiplexer 420b, and an output from OR gate 423 is coupled to a multiplexer 425. Multiplexer 425 is controlled by way of a programmable bit SB7. The output of OR gate 423 is also coupled to a multiplexer 427, which is also controlled by programmable bit SB7. Multiplexer 427 couples VSS or the output of OR gate 423 to PTA0, which passes logical information to other logic elements, without needing to use the local or global interconnect. In a specific embodiment, PTA0 coupled to only one other logic element.

Depending on a state of programmable bit SB0, the second output from multiplexer 420a programmable couples VDD or the output of AND gate 410 to multiplexer 425. Similarly, depending on a state of programmable bit SB1, multiplexer 420b couples VDD or the output of AND gate 412 to multiplexer 425. For example, product term P0 may be programmable coupled through multiplexer 420a to multiplexer 425. A first output from multiplexer 425 is used to programmably couple OR gate 423 or multiplexer 420b to an XOR gate 430. A second output from multiplexer 425 is used to programmably couple multiplexer 420a or multiplexer 420b to a 4-to-1 multiplexer 433. An output of 4-to-1 multiplexer 433 is coupled to an input of XOR gate 430. An output from XOR gate 430 is coupled to multiplexer 436. XOR gate 430 performs an XOR of the output of OR gate 423 and the output of multiplexer 433. Among other functional and logical uses, XOR gate 430 may be used to invert the polarity of logic. For example, XOR gate 430 may invert the output of OR gate 423 before passing the output signal to other components in the logic element. Multiplexer 436 is also coupled to the second output of multiplexer 420a. Multiplexer 436 is controlled by way of an NOR 438 of programmable bits SB10 and SB13.

The second output of multiplexer 420a may also be programmably coupled through a multiplexer 470 and an inverter 473 to generate an EXPWL signal. This is a shareable expander feature. Shareable expanders may be used to implement NAND and logic, which provides further logical capabilities when ANDed into the product terms for another logic array block. The EXPWL signal feeds back to the local interconnect of the LAB to enable the creation of expanded logical functions. For example, product term P0 may be furter combined with other product terms of other LE s in the LAB. In such a fashion, shareable expanders allows product terms to be expanded by sharing them among the LEs in a LAB. This feature allows logic cells to use uncommitted product terms and share them among other product terms in the LAB. This improves overall efficiency in utilizing the resources of the programmable logic device. The EXPWL signal may also be coupled through another LE to the global interconnect to allow expanded product terms across different LABs. Controlled by way of a programmable bit SB0, multiplexer 470 may also be used to provide a VDD for the EXPWL signal (i.e., VSS passes through multiplexer 470 and inverter 473) when the shareable expander feature is not used. Inverter 473 provides some buffering between the components.

Furthermore, in this embodiment of the present invention, the shareable expander features may be used with other LABs in a PLD without passing through the local interconnect. More specifically, for example, product term P0 may be used as a product term expander by programmably coupling it through multiplexer 420a and a 3-to-1 multiplexer 440, which is programmably controlled by programmable bit SB10, to the global interconnect. Using the global interconnect, product term P0 may be programmably coupled with product terms in other LABs. An advantage of this feature is that a LAB can lend some of its shareable expanders to other LABs. A LE can "donate" a shareable expander onto the global interconnect, giving more freedom to spread out the shareable expander usage among LABs. This feature allows the creation of a multitude of larger, more complex logical functions without wasting interconnection and logical resources.

Furthermore, when multiplier 440 is used to place a shareable expander on the global interconnect, multiplexer 458 will still be available so that the logic element can be used to provide combinatorial or registered logic. This allows further flexibility in the implementation of logical functions, and increases the overall available functionality.

The output from XOR gate 430 is further coupled to 3-to-1 multiplexer 440. An output from multiplexer 440 may be coupled to the global interconnect (i.e., GHS and GVs). In further embodiments of the present invention multiplexer 440 may also be coupled to the local interconnect of a LAB. For example, XOR gate 430 may be programmably coupled through multiplexer 440 and a GH line to provide logical signals for other LABs and LEs.

Multiplexer 436 may be programmably coupled through a multiplexer 442 to an input of a register 445. In a preferred embodiment, register 445 is a D-type register and multiplexer 442 is coupled to a D input of register 445. The D input is used for inputting data. However, in other embodiments of the present invention, other types of storage blocks may be used for register 445 including various types of latches, flip-flops, registers, memory cells, and many others. For example, register 445 may be a T flip-flop, S–R flip-flop, J–K flips-flop, or transparent latch.

A Q output of register 445 may be fed back through multiplexer 442 to the D input. The Q output may feed back to XOR gate 430 through 4-to-1 multiplexer 433, programmably controlled by programmable bits SB8 and SB9. The Q output may be coupled through multiplexer 440 to the global interconnect. A QB output of register 445 may programmably feedback through 4-to-1 multiplexer 433 to XOR gate 430. The QB output is the complement of the Q output.

The Q output may be fed back to the local interconnect through a multiplexer 458, programmably controlled by programmable bit SB13. Further, through multiplexer 458, the output of XOR gate 430 may be fed back to the local interconnect of the LAB. This path from XOR gate 430 bypasses register 445. Multiplexer 458 couples to the local interconnect of a LAB without needing to utilize the global interconnect. The path also includes a buffer 460 to provide the true and complement of the particular signal to the local interconnect. This allows greater flexibility when implementing logical functions.

A CLK input of register 445 is used for clocking. A first output of a multiplexer 450, controlled by way of programmable bit SB5, is used to couple a second output of multiplexer 420d or an output of multiplexer 454 to the CLK input. Through multiplexer 420d, product term P3 or VDD may be used to programmably control the CLK input. Alternatively, global clock signals GCLK0 or GCLK1 may be used to control the CLK input through multiplexer 454, programmably controlled by a programmable bit SB12. In a preferred embodiment, the global clock signals may be connected to a plurality of LABs and LEs on the chip through direct, dedicated lines without need to couple through the global and local interconnect.

A second output of multiplexer 450 is used to control the selection of multiplexer 442, which determines the D input of register 445. Product term P3 or VDD may be used to control the selection of multiplexer 442.

A CLR input is used to clear register 445. In a preferred embodiment, CLR is active low. A multiplexer 463, controlled by a programmable bit SB6, couples a second output of multiplexer 420c or an output of OR gate 465 through an inverter 464 to the CLR input. Through multiplexer 420c, product term P2 or VSS may be coupled to control the CLR input. Alternatively, via OR gate 465, the second output of multiplexer 420c may be ORed with an inverse of an NGCLR signal to control the CLR input. The NGCLR signal may be used as a global signal to implement a global clear signal to clear a plurality of registers 445 for a plurality of LEs.

A PRE input is used to preset register 445. In a preferred embodiment, the PRE input is active low. The PRE input is controlled using a second output from multiplexer 420e. Through multiplexer 420e, product term P4 or VSS may be programmably coupled to control the PRE input. Moreover, the CLR input may "override" the PRE input. To implement this, in a specific embodiment, the PRE input is coupled to an output of a NAND gate 468. NAND gate 468 has an input from an output of inverter 464 and an input from a second output of multiplexer 420e. Other embodiments may use different logical and circuit configurations to implement these functions.

The implementation shown in FIG. 4 merely illustrates the principles of the present invention, and many various circuit embodiments are possible. For example, local shareable expander path may be implemented by changing multiplexer 458 into a 3-to-1 multiplexer. Specifically, as in the case of multiplexer 440, multiplexer 458 would be coupled to the second output of multiplexer 420a. Then, product term P0 may utilize this feedback path through multiplexer 458 as a local shareable expander path back to the local interconnect. The dedicated shareable expander path, through multiplexer 470 and inverter 473, may be removed. However, the embodiment shown in FIG. 4 is generally preferred because it allows the feedback path through multiplexer 458 to be used at the same time the dedicated shareable expander path is used.

Also, multiplexer 458 may connect to the local or global interconnects by expanding this interconnect resource to include the output of multiplexer 458; this does not require a new dedicated line. Further, the output of multiplexer 458 may be coupled to this multiplexer in much the same way as other lines in the local or global interconnect.

The present invention also implements a lonely register architecture. Some of the LEs or macrocells may be used for both registered and combinatorial logic by appropriately configuring multiplexers 440 and 458.

The foregoing description of preferred embodiments of the invention has been presented for the purpose of illustrating and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A programmable logic device comprising:
   a programmable interconnect array; and
   a plurality of logic array blocks programmably coupled to the programmable interconnect array, wherein a logic array comprises:
   a plurality of product terms programmably configured to perform combinatorial logic;
   a register programmably coupled to the plurality of product terms; and
   a first multiplexer coupled to an output of the register, wherein a shareable product term of the plurality of product terms may be directly coupled to the programmable interconnect array and programmably combined with other product terms.

2. The programmable logic device of claim 1 wherein the first multiplexer may programmably couple the register to the programmable interconnect array.

3. The programmable logic device of claim 1 wherein the logic array block further comprises:
   an OR gate programmably coupled to the plurality of product terms, wherein an OR gate output may be programmably coupled through the first multiplexer to a local interconnect of the logic array block.

4. The programmable logic device of claim 2 wherein the logic array block further comprises:
   a second multiplexer coupled to the output of the register and the OR gate output, wherein the OR gate output may be programmably coupled through the second multiplexer to a local interconnect of the logic array block.

5. A digital system incorporating a programmable logic device as recited in claim 1.

6. A programmable logic device comprising:
   a programmable interconnect array;
   a plurality of logic array blocks programmably coupled to the programmable interconnect array, wherein a logic array block comprises:
   a plurality of product terms programmably configured to perform combinatorial logic, wherein one of the plurality of product terms may be directly coupled to the programmable interconnect array and programmably combined with other product terms.

7. The programmable logic device of claim 6 wherein the logic array block further comprises:
   a register, coupled to the plurality of product terms, configured to perform registered logic, wherein the plurality of product terms may bypass the register to programmably couple to the programmable interconnect array.

8. A programmable logic device having a plurality of logic array blocks programmably coupled by a programmable interconnect array each logic array block having a plurality of macrocells, each macrocell comprising:
   a plurality of logic modules programmably configured to perform logic;
   an OR gate coupled to the plurality of logic modules;
   a register coupled to the OR gate;
   a first multiplexer couple to the OR gate and the register, wherein the first multiplexer programmably couples a shareable logic module of the plurality of logic modules to a programmable interconnect array to be programmably combined with a logic module in one of the plurality logic array blocks.

9. The programmable logic device of claim 8 wherein each macrocell further comprises:
a second multiplexer coupled to the OR gate and the register, wherein the second multiplexer programmably couples the shareable logic module of the plurality of logic modules to the logic modules in a logic array block without using the programmable interconnect array.

10. The programmable logic device of claim 8 wherein the OR gate may be programmably coupled through the first multiplexer to the programmable interconnect array, bypassing the register.

11. The programmable logic device of claim 8 further comprising:
an XOR gate, programmably coupled between the OR gate or one of the plurality of logic modules and the register.

12. The programmable logic device of claim 8 wherein each macrocell further comprises:
a second multiplexer coupled to the OR gate and the register, wherein the second multiplexer programmably couples the shareable logic module, register, or an XOR gate to the programmable interconnect array.

13. A programmable logic integrated circuit comprising:
a programmable interconnect array;
a plurality of logic array blocks programmably coupled to the programmable interconnect array, where a logic array block comprises:
a local interconnect array coupled to the programmable interconnect array;
a logic module, coupled to the local interconnect array, configurable to perform combinatorial logic functions, wherein the logic module is programmably coupled to a logic module in another logic array block, without using the programmable interconnect array;
a register, coupled to the logic module, configurable to perform sequential logic functions;
a first multiplexer, coupled to the logic module, register, and programmable interconnect array; and
a second multiplexer, coupled to the logic module, register, and local interconnect array.

14. The programmable logic integrated circuit of claim 13 wherein the logic module is configurable to perform an AND function.

15. The programmable logic integrated circuit of claim 13 wherein the register comprises a clear input, programmably coupled to the logic modules.

16. The programmable logic integrated circuit of claim 13 wherein the register comprises a present input, programmably coupled to the logic module.

17. The programmable logic integrated circuit of claim 13 wherein the register comprises a clock input, programmably coupled to the logic module or a global clock line.

18. The programmable logic intergrated circuit of claim 13 wherein the logic array block further comprises:
a logic gate coupled to the logic module, wherein an output of the logic gate is coupled to the register and the first multiplexer.

19. The programmable logic integrated circuit of claim 13 wherein the logic array block further comprises:
a third multiplexer having inputs coupled to a first output and a second output of the register, and the third multiplexer has an output coupled to an input of the register.

20. The programmable logic integrated circuit of claim 13 wherein the register is a D-type register.

21. A logic block for a programmable integrated circuit comprising:
a first logic module;
a second logic module;
a register;
a first multiplexer coupled to the first and second logic modules;
a second multiplexer coupled to the first multiplexer and an output of the register, and the second multiplexer is coupled to an input of the register; and
a third multiplexer coupled to the output of the register and a programmable interconnect of the programmable integrated circuit.

22. The logic block of claim 21 wherein the first logic module is shareable with another logic block of the programmable integrated circuit.

23. The logic block of claim 21 further comprising:
a fourth multiplexer coupled to the register and the second logic module, and coupled to a local interconnect of the logic block.

24. The logic block of claim 21 wherein the first and second logic modules are product terms.

25. The logic block of claim 21 further comprising:
an OR gate coupled between the second logic module and the register.

26. A programmable logic integrated circuit comprising:
a programmable interconnect; and
a plurality of logic array blocks programmably coupled to the programmable interconnect, wherein a logic array block comprises:
a local interconnect;
a logic module configurable to perform combinatorial logic;
a register configurable to perform registered logic;
a first multiplexer comprising an output coupled to the programmable interconnect; and
a second multiplexer comprising an output coupled to the local interconnect, wherein the first and second multiplexers are configurable in a first state to couple combinatorial logic to the programmable interconnect and the local interconnect, configurable in a second state to couple registered logic to the programmable interconnect and combinatorial logic to the local interconnect, configurable in a third state to couple combinatorial logic to the programmable interconnect and registered logic to the local interconnect, and configurable in a fourth state to couple registered logic to the programmable interconnect and local interconnect.

27. The programmable logic integrated circuit of claim 26 wherein the register is a D-register.

28. The programmable logic integrated circuit of claim 26 wherein the first and second multiplexers are configurable by programming two programmable bits.

29. The programmable logic integrated circuit of claim 26 wherein the local interconnect is programmably coupled to the logic module.

30. The programmable logic integrated circuit of claim 26 wherein the logic module can output a Boolean result of an AND function of two input logical signals.

31. The programmable logic integrated circuit of claim 26 wherein an output of the logical module can be input to the register.

* * * * *

UNITED STATES PATENT AND TRADEMARK OFFICE
CERTIFICATE OF CORRECTION

PATENT NO. : 6,246,260 B1
DATED : June 12, 2001
INVENTOR(S) : Mendel

It is certified that error appears in the above-identified patent and that said Letters Patent is hereby corrected as shown below:

Column 10,
Line 65, delete "couple" and insert therefor -- coupled --.

Signed and Sealed this

Twenty-eighth Day of January, 2003

JAMES E. ROGAN
*Director of the United States Patent and Trademark Office*